United States Patent
Nakasendo et al.

(10) Patent No.: US 9,063,871 B2
(45) Date of Patent: Jun. 23, 2015

(54) DECODING DEVICE AND DECODING METHOD

(71) Applicant: PANASONIC INTELLECTUAL PROPERTY MANAGEMENT CO., LTD., Osaka (JP)

(72) Inventors: Tsuyoshi Nakasendo, Hyogo (JP); Yasumori Hino, Nara (JP); Kohei Nakata, Nara (JP); Yuji Takagi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 37 days.

(21) Appl. No.: 14/112,396

(22) PCT Filed: Apr. 1, 2013

(86) PCT No.: PCT/JP2013/002261
§ 371 (c)(1),
(2) Date: Oct. 17, 2013

(87) PCT Pub. No.: WO2013/150774
PCT Pub. Date: Oct. 10, 2013

(65) Prior Publication Data
US 2014/0053044 A1   Feb. 20, 2014

(30) Foreign Application Priority Data

Apr. 4, 2012 (JP) .................. 2012-085614

(51) Int. Cl.
*G06F 11/10* (2006.01)
*H03M 13/45* (2006.01)
(Continued)

(52) U.S. Cl.
CPC ............... *G06F 11/10* (2013.01); *H03M 13/45* (2013.01); *H03M 13/1111* (2013.01);
(Continued)

(58) Field of Classification Search
CPC . H03M 13/23; H03M 13/41; H03M 13/2957; H03M 13/45; H03M 13/6343; H03M 13/6577; G11B 20/10361; G11B 20/1833; G06F 11/10
USPC .................. 714/776, 786, 791, 795
See application file for complete search history.

(56) References Cited

U.S. PATENT DOCUMENTS 4,998,253 A * 3/1991 Ohashi et al. .................. 714/791
6,487,236 B1 * 11/2002 Iwamatsu et al. ............. 375/148
(Continued)

FOREIGN PATENT DOCUMENTS

JP   2004-335000   11/2004
JP   2005-141887   6/2005
(Continued)

OTHER PUBLICATIONS

International Search Report issued May 7, 2013 in International (PCT) Application No. PCT/JP2013/002261.
(Continued)

*Primary Examiner* — Phung M Chung
(74) *Attorney, Agent, or Firm* — Wenderoth, Lind & Ponack, L.L.P.

(57) ABSTRACT

A decoding device (1) has: a reliability calculating unit (5) which calculates reliability information having a non-linear relationship with a noise distribution of a PR communication path (3) in at least part of or all of the reliability information based on characteristics of the PR communication path (3) and a predetermined modulation rule from an encoded signal that is obtained from the PR communication path (3); a reliability correcting unit (17) which corrects the reliability information calculated by a reliability calculating unit (5); and an error correction decoding unit (18) which performs error correction decoding on the reliability information corrected by the reliability correcting unit (17).

12 Claims, 8 Drawing Sheets

(51) Int. Cl.
*H03M 13/29* (2006.01)
*H03M 13/00* (2006.01)
*G11B 20/10* (2006.01)
*G11B 20/18* (2006.01)
*H03M 13/11* (2006.01)

(52) U.S. Cl.
CPC ..... *H03M 13/2957* (2013.01); *H03M 13/6343* (2013.01); *H03M 13/6577* (2013.01); *G11B 20/10361* (2013.01); *G11B 20/1833* (2013.01)

(56) References Cited

U.S. PATENT DOCUMENTS

| | | | |
|---|---|---|---|
| 6,650,790 B1 * | 11/2003 | Arbeiter et al. | 382/275 |
| 7,500,166 B2 * | 3/2009 | Miyazaki et al. | 714/748 |
| 7,895,505 B2 * | 2/2011 | Hamamoto | 714/786 |
| 8,269,843 B2 * | 9/2012 | Luo et al. | 348/208.4 |
| 2005/0120286 A1 | 6/2005 | Akamatsu | |
| 2006/0120244 A1 | 6/2006 | Miyauchi et al. | |
| 2008/0104486 A1 | 5/2008 | Kanaoka | |
| 2011/0044409 A1 * | 2/2011 | Yoshimoto et al. | 375/340 |

FOREIGN PATENT DOCUMENTS

| | | |
|---|---|---|
| JP | 2005-166089 | 6/2005 |
| JP | 2007-272973 | 10/2007 |
| JP | 2008-112527 | 5/2008 |

OTHER PUBLICATIONS

Eiji Yamada et al., "Turbo Decoding with Run Length Limited Code for Optical Storage", Japanese Journal of Applied Physics, Mar. 2002, vol. 41 (2002), pp. 1753-1756, Part 1, No. 3B.

* cited by examiner

DECODING DEVICE AND DECODING METHOD

TECHNICAL FIELD

The present invention relates to a decoding device and a decoding method for decoding an encoded signal that is obtained when an encoded sequence generated by performing error correction encoding on input data according to a predetermined error correction encoding system and performing modulation encoding according to a predetermined modulation rule passes through a communication path.

BACKGROUND ART

In recent years, in communication, broadcasting, and even with recording information on or reproducing information from an optical disk or a magnetic disk, recording/reproducing devices for handling soft decision values obtained by calculating reliability information are being proposed in order to utilize a turbo code or an LDPC code (a low-density parity check code) which are known to produce error correcting performances that approach theoretical limitations (for example, refer to Patent Literature 1).

FIG. 8 is a diagram showing a configuration of a conventional recording/reproducing device which handles soft decision values. In FIG. 8, a recording/reproducing device 101 comprises an encoding unit 102, a PR (Partial Response) communication path 103, and a decoding unit 104.

The encoding unit 102 comprises an error correction encoding unit 111 and a modulation encoding unit 112. The error correction encoding unit 111 generates an error correction encoded sequence by adding a parity sequence based on a predetermined rule to an inputted user data sequence. The modulation encoding unit 112 encodes the inputted error correction encoded sequence to a predetermined modulation code based on a predetermined modulation rule, and outputs the modulation code to which a predetermined constraint has been added as an encoded sequence to the PR communication path 103.

Moreover, examples of a constraint that is used as the predetermined constraint include a DC free constraint in which the numbers of "0"s and "1"s in a code are equalized over a sufficiently long range and a (d, k) constraint in which a minimum length and a maximum length of the number of consecutive "0"s respectively take values of d and k.

The PR communication path 103 comprises a recording/reproducing unit 113 and an equalization processing unit 114. For example, the PR communication path 103 performs a recording process or a reproducing process in a PR2 (Partial Response class-2) recording/reproducing channel.

The recording/reproducing unit 113 performs NRZI (non return to zero Inverted) encoding on the encoded sequence inputted from the modulation encoding unit 112, and records the NRZI-encoded signal on a mounted recording medium or a built-in recording medium using a mark edge recording method.

In addition, the recording/reproducing unit 113 reads out an encoded signal recorded on the recording medium in the PR2 channel and supplies the read encoded signal to the equalization processing unit 114.

The equalization processing unit 114 performs a PR (Partial Response) equalization process that utilizes a waveform interference on the encoded signal supplied from the recording/reproducing unit 113 so that predetermined target equalization characteristics are produced, and supplies the encoded signal to the decoding unit 104.

The decoding unit 104 comprises a PR-SISO decoding unit 115, a SISO demodulating unit 116, and an error correction decoding unit 117. The PR-SISO decoding unit 115 performs a predetermined decoding process on the encoded signal supplied from the equalization processing unit 114 and outputs a soft decision value.

In this case, SISO stands for Soft-Input Soft-Output which refers to a process for inputting and outputting a soft decision value.

The PR-SISO decoding unit 115 obtains a trellis expression that is an expansion, along a time series, of a state transition chart which represents an encoding process at each time based on the NRZI encoding and the PR2 channel from the encoded signal from the PR communication path 103, performs a probability operation based on the obtained trellis expression, and calculates reliability information as a soft decision value.

The SISO demodulating unit 116 calculates reliability information that has been modulation-decoded using a trellis based on the modulation rule of the modulation encoding unit 112.

For example, the calculation of reliability information using a trellis by the PR-SISO decoding unit 115 and the SISO demodulating unit 116 is executed by a BCJR (Bahl-Cocke-Jeinek-Raviv) algorithm.

For example, the error correction decoding unit 117 uses turbo decoding. The error correction decoding unit 117 executes error correction by performing turbo decoding that corresponds to the turbo code used by the error correction encoding unit 111. Moreover, Patent Literature 1 also presents an example of error correction decoding performed using an LDPC code.

Moreover, hereinafter, unless otherwise noted, reliability information refers to a logarithmic ratio of a decoding probability of a symbol or a minimum unit of information. For example, the minimum unit of information may be a bit that represents a binary code or, in other words, "0" and "1" or may be a multilevel element.

In addition, Patent Literature 2 describes a Sum-Product algorithm that realizes decoding by an LDPC code.

Furthermore, Non Patent Literature 1 describes an embodiment of soft decision decoding by a trellis that is based on a PR communication path and a modulation rule when processing a signal on an optical disk.

However, with a conventional decoding system based on a modulation rule that limits an appearance pattern of symbols of recorded information on an optical disk or a magnetic disk, the reliability information that is calculated by the SISO demodulating unit 116 shown in FIG. 8 may not be correlated with a noise distribution of a communication path. For example, there may be cases where a bias in distribution of reliability information occurs such as when reliability information is distributed over a wide range.

In addition, even in the field of optical communication, since a band of a transmission signal is limited according to characteristics of an optical fiber, a modulation rule is conceivable which limits an appearance pattern of symbols in transmitted information. For example, there may be cases where a bias in distribution of reliability information occurs such as when reliability information is distributed over a wide range.

Such a distribution bias may include an error bit with high reliability. This may occur when, for example, a given modulation pattern is demodulated as another modulation pattern and the given modulation pattern is SISO-demodulated as a modulation pattern with high reliability even though the given modulation pattern includes an error.

When error correction is performed on reliability information including an error bit with high reliability, the reliability information cannot be stochastically properly error-corrected. As a result, an error floor may be created in which an error occurs even in an ideal environment where an error probability of a communication path is sufficiently low.

CITATION LIST

Patent Literature

Patent Literature 1: Japanese Patent Application Laid-open No. 2005-141887
Patent Literature 2: Japanese Patent Application Laid-open No. 2007-272973

Non Patent Literature

Non Patent Literature 1: Eiji Yamada, Tetsuo Iwaki, and Takeshi Yamaguchi, "Turbo Decoding with Run Length Limited Code for Optical Storage", Japanese journal of applied physics, March 2002, Vol. 41 (2002), pp. 1753-1756, Part 1, No. 3B

SUMMARY OF THE INVENTION

The present invention has been made in order to solve the problems described above and an object thereof is to provide a decoding device and a decoding method capable of preventing an occurrence of an error bit with a high reliability and improving decoding performance.

A decoding device according to an aspect of the present invention is a decoding device which decodes an encoded signal that is obtained when an encoded sequence generated by performing error correction encoding on input data according to a predetermined error correction encoding system and performing modulation encoding according to a predetermined modulation rule passes through a communication path, the decoding device comprising: a reliability information calculating unit which calculates reliability information having a non-linear relationship with a noise distribution of the communication path in at least part of or all of the reliability information based on characteristics of the communication path and the predetermined modulation rule from the encoded signal that is obtained from the communication path; a reliability information correcting unit which corrects the reliability information calculated by the reliability information calculating unit; and an error correction decoding unit which performs error correction decoding on the reliability information corrected by the reliability information correcting unit.

According to this configuration, a reliability information calculating unit calculates reliability information having a non-linear relationship with a noise distribution of a communication path in at least part of or all of the reliability information based on characteristics of the communication path and a predetermined modulation rule from an encoded signal that is obtained from the communication path. A reliability information correcting unit corrects the reliability information calculated by the reliability information calculating unit. An error correction decoding unit performs error correction decoding on the reliability information corrected by the reliability information correcting unit.

According to the present invention, since reliability information having a non-linear relationship with a noise distribution of a communication path in at least part of or all of the reliability information is corrected, an occurrence of an error bit with high reliability can be prevented and decoding performance can be improved.

This and other objects, features, and advantages of the present invention will become more apparent as the following detailed description is read with reference to the accompanying drawings.

DESCRIPTION OF EMBODIMENTS

Hereinafter, embodiments of the present invention will be described with reference to the drawings as appropriate. Moreover, even if an embodiment described in the present specification is not described as being associated with an invention, the absence of such a description does not imply that the embodiment is not associated with the invention. Conversely, even if an embodiment is described in the present specification as being associated with an invention, such a description does not imply that the embodiment is not associated with other inventions.

First Embodiment

Figure 1:
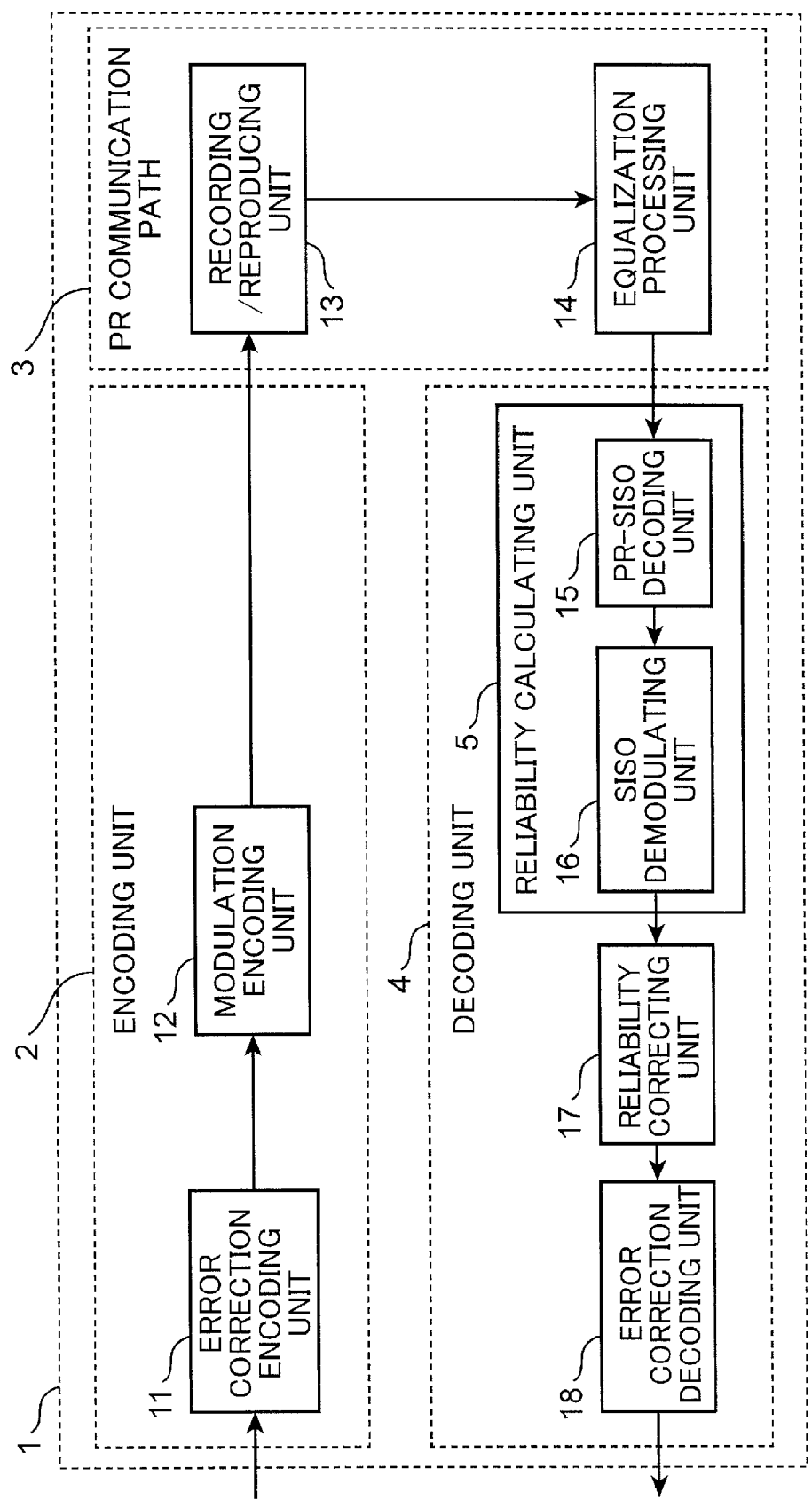
FIG. 1 is a diagram showing a configuration of a decoding device according to a first embodiment of the present invention.

FIG. 1 is a diagram showing a configuration of a decoding device according to a first embodiment of the present invention. A decoding device 1 shown in FIG. 1 comprises an encoding unit 2, a PR (Partial Response) communication path 3, and a decoding unit 4. The decoding device 1 decodes an encoded signal that is obtained when an encoded sequence generated by performing error correction encoding on input data according to a predetermined error correction encoding system and performing modulation encoding according to a predetermined modulation rule passes through the PR communication path 3.

The encoding unit 2 comprises an error correction encoding unit 11 and a modulation encoding unit 12. The error correction encoding unit 11 performs error correction encoding on input data in accordance with a predetermined error correction encoding system and outputs an encoded sequence subjected to the error correction encoding. The error correction encoding unit 11 generates an error correction encoded sequence by adding a parity sequence based on a predetermined rule to an inputted user data sequence. For example, the error correction encoding unit 11 performs encoding based on an LDPC code.

The modulation encoding unit 12 performs modulation encoding in accordance with a predetermined modulation rule on the encoded sequence subjected to the error correction encoding. The modulation encoding unit 12 encodes the inputted error correction encoded sequence to a predetermined modulation code based on a predetermined modulation rule, and outputs the modulation code to which a predetermined constraint has been added as an encoded sequence to the PR communication path 3.

Moreover, examples of a constraint that is used as the predetermined constraint include a DC free constraint in which the numbers of "0"s and "1"s in a code are equalized over a sufficiently long range and a (d, k) constraint in which a minimum length and a maximum length of the number of consecutive "0"s respectively take values of d and k.

The PR communication path 3 comprises a recording/reproducing unit 13 and an equalization processing unit 14. For example, the PR communication path 3 performs a recording process or a reproducing process in a PR2 recording/reproducing channel.

The recording/reproducing unit 13 records the modulation-encoded encoded sequence on a recording medium or reproduces an encoded signal that is recorded on a recording medium. The recording/reproducing unit 13 performs NRZI encoding on the encoded sequence that is inputted from the modulation encoding unit 12 and records the NRZI-encoded encoded signal on a mounted recording medium or a built-in recording medium using a mark edge recording method.

In addition, the recording/reproducing unit 13 reads out an encoded signal recorded on the recording medium in the PR2 channel and supplies the read encoded signal to the equalization processing unit 14. Moreover, for example, types of partial responses by the recording/reproducing unit 13 include PR121, PR1221, PR12221, and PR122221.

The equalization processing unit 14 performs a predetermined equalization process on the encoded signal that is reproduced by the recording/reproducing unit 13. The equalization processing unit 14 performs a PR equalization process that utilizes a waveform interference on the encoded signal supplied from the recording/reproducing unit 13 so that predetermined target equalization characteristics are produced, and supplies the encoded signal subjected to the PR equalization process to the decoding unit 4.

The decoding unit 4 comprises a reliability calculating unit 5, a reliability correcting unit 17, and an error correction decoding unit 18.

The reliability calculating unit 5 calculates reliability information having a non-linear relationship with a noise distribution of the PR communication path 3 in at least part of or all of the reliability information based on characteristics of the PR communication path 3 and a predetermined modulation rule from the encoded signal that is obtained from the PR communication path 3. The reliability calculating unit 5 calculates reliability information based on the characteristics of the PR communication path 3 and a predetermined modulation rule from the encoded signal subjected to the equalization process by the equalization processing unit 14. The reliability calculating unit 5 comprises a PR-SISO decoding unit 15 and a SISO demodulating unit 16.

The PR-SISO decoding unit 15 calculates reliability information according to a trellis based on the characteristics of the PR communication path 3 from the signal supplied from the equalization processing unit 14. The SISO demodulating unit 16 calculates reliability information according to a trellis based on the modulation rule used when modulation encoding is performed by the modulation encoding unit 12 from the reliability information supplied from the PR-SISO decoding unit 15.

Moreover, while the reliability calculating unit 5 comprises the PR-SISO decoding unit 15 and the SISO demodulating unit 16, the present invention is not limited thereto. For example, the reliability calculating unit 5 may comprise a PR demodulating-SISO decoding unit which calculates reliability information based on a trellis that is a composite of a trellis of the PR characteristics of the PR communication path 3 and a trellis of the modulation rule.

For example, the reliability calculating unit 5 supplies reliability information with a wide distribution to the reliability correcting unit 17. The reliability correcting unit 17 corrects the reliability information calculated by the reliability calculating unit 5. The error correction decoding unit 18 performs error correction decoding on the reliability information corrected by the reliability correcting unit 17.

Moreover, in the present first embodiment, the decoding device 1 corresponds to an example of the decoding device, the PR communication path 3 corresponds to an example of the communication path, the reliability calculating unit 5 corresponds to an example of the reliability information calculating unit, the reliability correcting unit 17 corresponds to an example of the reliability information correcting unit, the error correction decoding unit 18 corresponds to an example of the error correction decoding unit, the error correction encoding unit 11 corresponds to an example of the error correction encoding unit, the modulation encoding unit 12 corresponds to an example of the modulation encoding unit, the recording/reproducing unit 13 corresponds to an example of the recording or reproducing unit, and the equalization processing unit 14 corresponds to an example of the equalization processing unit.

Figure 2:
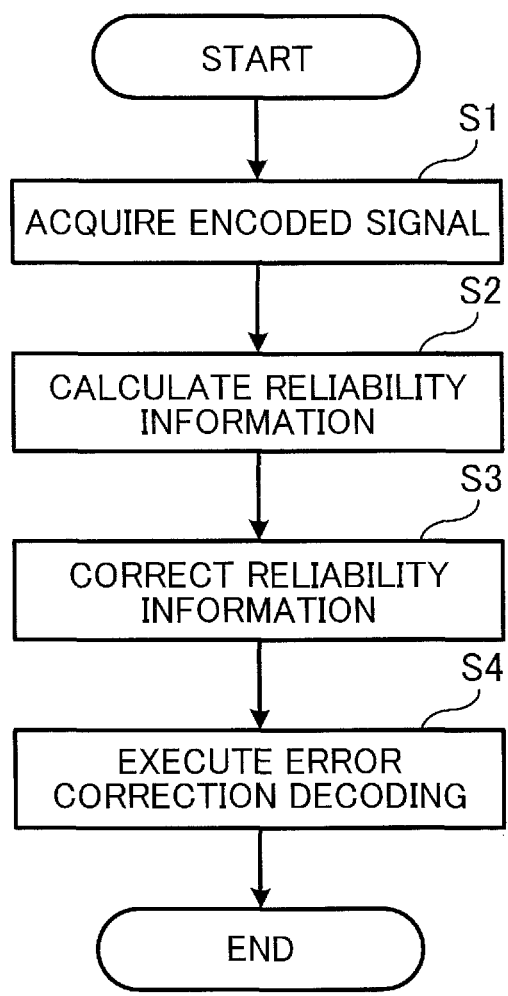
FIG. 2 is a flow chart for describing a decoding operation of the decoding device according to the first embodiment of the present invention.

A decoding operation by the decoding device 1 will now be described. FIG. 2 is a flow chart for describing a decoding operation by the decoding device according to the first embodiment of the present invention.

First, in step S1, the reliability calculating unit 5 acquires an encoded signal subjected to an equalization process by the equalization processing unit 14 of the PR communication path 3.

Next, in step S2, the reliability calculating unit 5 calculates reliability information based on the characteristics of the PR communication path 3 and a predetermined modulation rule from the encoded signal subjected to the equalization process by the equalization processing unit 14. The reliability calculating unit 5 decodes the encoded signal using a trellis based on the predetermined modulation rule. In other words, input data is a sequence of pre-modulation symbols which are a set of minimum units of information. The reliability calculating unit 5 calculates reliability information based on a trellis in which a case exists where the number of combinations of pre-modulation symbols that are decoding objects of modulation symbols generated by performing modulation encoding on the pre-modulation symbols is larger than the number of combinations of pre-modulation symbols with an unequal decoding probability among the decoding objects or a trellis in which a case exists where there is a bias in an appearance frequency of minimum units of information which constitute a pre-modulation symbol among combinations of pre-modulation symbols with an unequal decoding probability.

Specifically, the PR-SISO decoding unit 15 calculates reliability information according to a trellis based on the characteristics of the PR communication path 3 from the encoded signal supplied from the equalization processing unit 14. The SISO demodulating unit 16 calculates reliability information according to a trellis based on the modulation rule used when modulation encoding is performed by the modulation encoding unit 12 from the reliability information supplied from the PR-SISO decoding unit 15.

Next, in step S3, the reliability correcting unit 17 corrects the reliability information calculated by the reliability calculating unit 5.

A correcting process by the reliability correcting unit 17 according to the present first embodiment will now be described.

Figure 3:
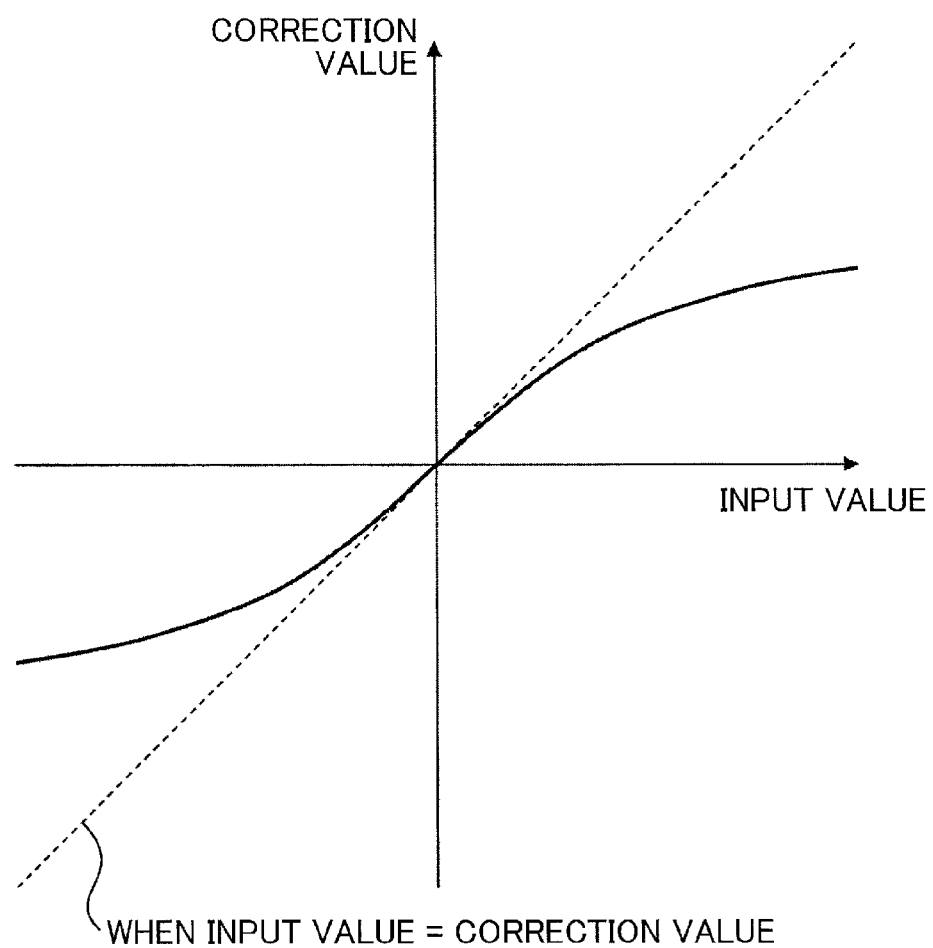
FIG. 3 is a diagram for describing a correction process by a reliability correcting unit.

FIG. 3 is a diagram for describing a correction process by the reliability correcting unit. Moreover, in FIG. 3, an abscissa represents an input value to the reliability correcting unit 17 and an ordinate represents a correction value outputted from the reliability correcting unit 17. For example, the reliability correcting unit 17 corrects reliability information so that a correction value monotonically increases with respect to an input value and a variation in the correction value decreases as the input value is distanced from an origin as in the example of a relationship between an input value and a correction value which is depicted by a solid line in FIG. 3. Accordingly, an adverse effect when reliability information with a large value is erroneous can be prevented.

In addition, the reliability correcting unit 17 may set an absolute value of a positive threshold and an absolute value of a negative threshold which are equal to each other. In this case, the reliability correcting unit 17 corrects reliability information so as to replace an absolute value of a positive input value which exceeds the absolute value of the positive threshold with the absolute value of the positive threshold and to replace an absolute value of a negative input value which exceeds the absolute value of the negative threshold with the absolute value of the negative threshold. In this case, favorably, the absolute value of the positive threshold is equal to or smaller than one half of an average of absolute values of positive reliability information and the absolute value of the negative threshold is equal to or smaller than one half of an average of absolute values of negative reliability information. Moreover, lower limits of the absolute value of the positive threshold and the absolute value of the negative threshold are not particularly set.

For example, the reliability correcting unit 17 sets a value that is equal to or smaller than one half of an average of absolute values of reliability information as a threshold, and when there is reliability information that exceeds the threshold, the reliability correcting unit 17 replaces an absolute value of the reliability information with the threshold.

Moreover, when there is a bias in a frequency of occurrence of input data or the like, the reliability correcting unit 17 may set an absolute value of a positive threshold and an absolute value of a negative threshold which differ from each other. In this case, the reliability correcting unit 17 corrects reliability information so as to replace an absolute value of a positive input value which exceeds the absolute value of the positive threshold with the absolute value of the positive threshold and to replace an absolute value of a negative input value which exceeds the absolute value of the negative threshold with the absolute value of the negative threshold. In this case, favorably, the absolute value of the positive threshold is equal to or smaller than one half of an average of absolute values of positive reliability information and the absolute value of the negative threshold is equal to or smaller than one half of an average of absolute values of negative reliability information. Moreover, lower limits of the absolute value of the positive threshold and the absolute value of the negative threshold are not particularly set.

After executing the correcting process, the reliability correcting unit 17 outputs the corrected reliability information to the error correction decoding unit 18.

In this case, for example, reliability information is a logarithmic ratio of a probability of a bit being decoded. Therefore, in LDPC decoding, reliability information near an origin which cannot be stochastically determined to be erroneous or not plays a huge role in a decoding result and the further a value of reliability information is distanced from the origin, the smaller the influence of the reliability information on the decoding result. This fact has been readily confirmed by an LDPC decoding simulation performed by the present inventors in which an upper limit of reliability information had been set.

The above demonstrates that a decoding result is not significantly affected even when, for example, the reliability correcting unit 17 sets a value that is larger than one half of an average of absolute values of positive reliability information as an absolute value of the positive threshold and sets a value that is larger than one half of an average of absolute values of negative reliability information as an absolute value of the negative threshold.

Furthermore, accordingly, an occurrence of an error bit having high reliability information due to a communication path or a modulation rule can be prevented. As a result, LDPC decoding performance can be improved by avoiding failures in LDPC decoding.

Next, in step S4, for example, the error correction decoding unit 18 executes LDPC decoding by a Sum-Product algorithm using reliability information corrected by the reliability correcting unit 17 as input.

At this point, since a distribution of reliability information that is inputted to the error correction decoding unit 18 is prevented from including high absolute values due to correction by the reliability correcting unit 17, high reliability information can be prevented from becoming associated with an error bit.

Accordingly, failures in error correction due to high reliability information being associated with error bits can be prevented and original decoding performance of LDPC decoding can be realized.

Moreover, for example, the reliability information inputted to the reliability correcting unit 17 may be two or more types of reliability information based on hard decision values.

The decoding device 1 according to the present first embodiment may be any of an independent device, a block which performs a decoding process of a recording/reproducing device, and a block which performs a decoding process of an optical communication device.

Second Embodiment

A decoding device according to a second embodiment of the present invention will be described. The decoding device according to the second embodiment of the present invention records an encoded signal on a recording medium, and reproduces an encoded signal from a recording medium and decodes the reproduced encoded signal.

Moreover, a configuration of the decoding device according to the second embodiment is the same as the configuration of the decoding device 1 according to the first embodiment shown in FIG. 1. Therefore, the decoding device according to the present second embodiment will be described with reference to FIG. 1. In addition, in the present second embodiment, a detailed description of the decoding device 1 will be omitted and only a recording operation and a reproducing operation of the decoding device 1 will be described.

Figure 4:
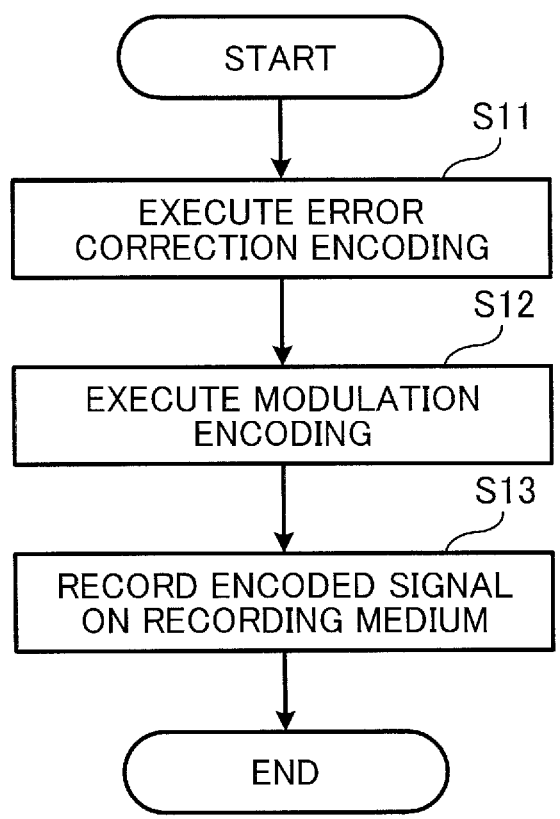
FIG. 4 is a flow chart for describing a recording operation of a decoding device according to a second embodiment of the present invention.

FIG. 4 is a flow chart for describing a recording operation by the decoding device according to the second embodiment of the present invention.

First, in step S11, the error correction encoding unit 11 performs error correction encoding according to the LDPC encoding system on input data and outputs an encoded signal subjected to the error correction encoding.

Next, in step S12, the modulation encoding unit 12 performs modulation encoding according to 17PP encoding on the encoded signal subjected to the error correction encoding by the error correction encoding unit 11.

Next, in step S13, the recording/reproducing unit 13 records the encoded signal subjected to the modulation encoding by the modulation encoding unit 12 on a recording medium. The recording/reproducing unit 13 performs NRZI encoding on the encoded signal inputted from the modulation encoding unit 12 and records the NRZI-encoded encoded signal on the recording medium. Moreover, for example, the recording medium is an optical disk.

Figure 5:
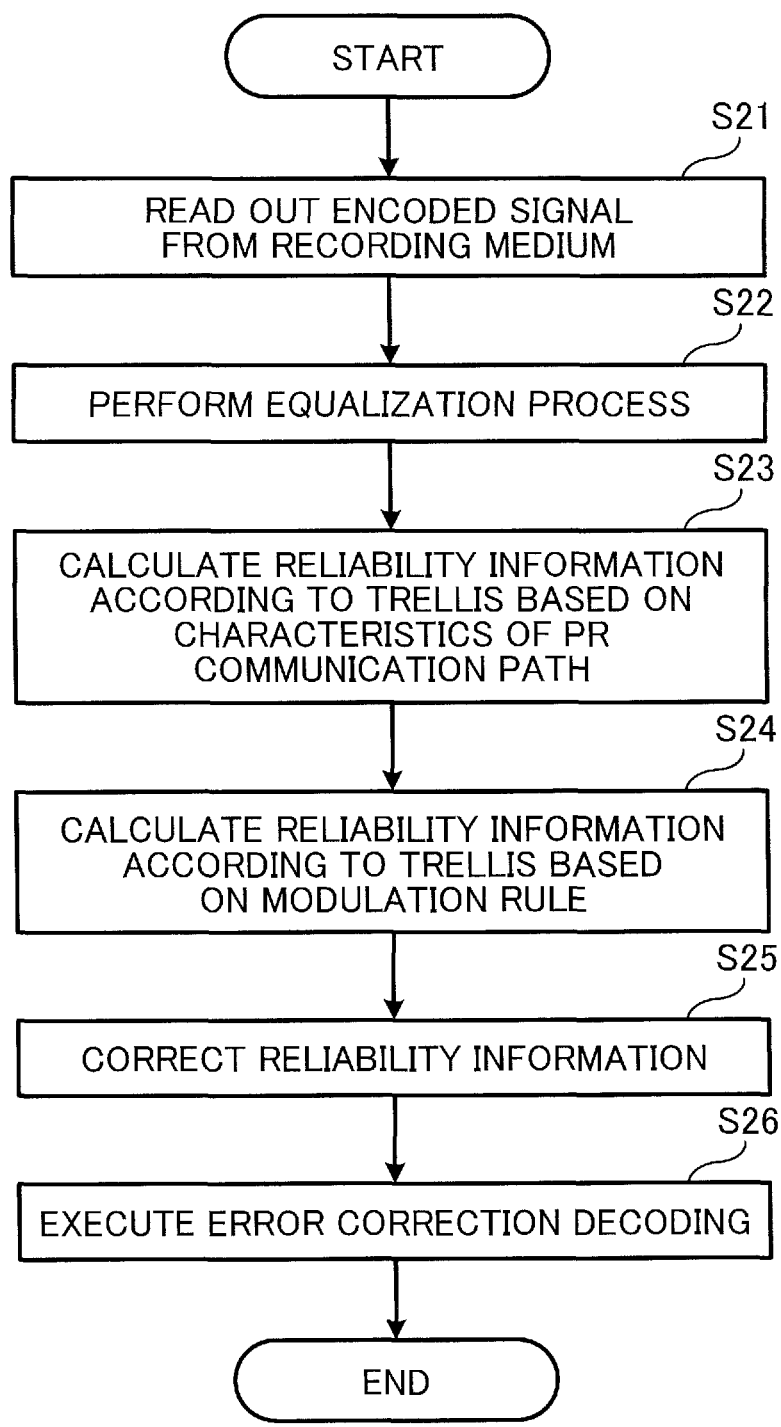
FIG. 5 is a flow chart for describing a reproducing operation of the decoding device according to the second embodiment of the present invention.

FIG. 5 is a flow chart for describing a reproducing operation by the decoding device according to the second embodiment of the present invention.

First, in step S21, the recording/reproducing unit 13 reads out an encoded signal recorded on a recording medium in the PR2 channel and supplies the read encoded signal to the equalization processing unit 14.

Next, in step S22, the equalization processing unit 14 performs a PR equalization process that utilizes a waveform interference on the encoded signal supplied from the recording/reproducing unit 13 so that predetermined target equalization characteristics are produced.

Next, in step S23, the PR-SISO decoding unit 15 calculates reliability information according to a trellis based on the characteristics of the PR communication path 3 from the encoded signal supplied from the equalization processing unit 14.

Next, in step S24, the SISO demodulating unit 16 calculates reliability information according to a trellis based on the modulation rule used when modulation encoding had been performed by the modulation encoding unit 12 from the reliability information supplied from the PR-SISO decoding unit 15.

Next, in step S25, the reliability correcting unit 17 corrects the reliability information supplied from the SISO demodulating unit 16.

Next, in step S26, the error correction decoding unit 18 performs LDPC decoding on the reliability information corrected by the reliability correcting unit 17.

Third Embodiment

A decoding device according to a third embodiment of the present invention will be described.

Moreover, with the decoding device according to the third embodiment, since a configuration with the exception of the reliability correcting unit 17 is the same as that of the decoding device 1 according to the first embodiment or the second embodiment, only operations of the reliability correcting unit 17 which constitutes a difference will be described. Since the configuration other than the reliability correcting unit 17 is the same as that of the first embodiment or the second embodiment, a description thereof will be omitted.

The reliability correcting unit 17 according to the third embodiment sets an absolute value of a positive threshold equal to or smaller than one half of an average of absolute values of inputted positive reliability information and sets an absolute value of a negative threshold equal to or smaller than one half of an average of absolute values of inputted negative reliability information. The reliability correcting unit 17 individually sets the positive threshold and the negative threshold. When inputted reliability information is positive, the reliability correcting unit 17 replaces an absolute value of the positive reliability information with the absolute value of the positive threshold, and when inputted reliability information is negative, the reliability correcting unit 17 replaces an absolute value of the negative reliability information with the absolute value of the negative threshold.

Fourth Embodiment

A decoding device according to a fourth embodiment of the present invention will be described.

Moreover, with the decoding device according to the fourth embodiment, since a configuration with the exception of the reliability correcting unit 17 is the same as that of the decoding device 1 according to the first embodiment or the second embodiment, only operations of the reliability correcting unit 17 which constitutes a difference will be described. Since the configuration other than the reliability correcting unit 17 is the same as that of the first embodiment or the second embodiment, a description thereof will be omitted.

The reliability correcting unit 17 according to the fourth embodiment sets a threshold determined in advance. The reliability correcting unit 17 corrects reliability information so as to replace an absolute value of an input value which exceeds an absolute value of the threshold with the absolute value of the threshold.

Fifth Embodiment

A decoding device according to a fifth embodiment of the present invention will be described.

Figure 6:
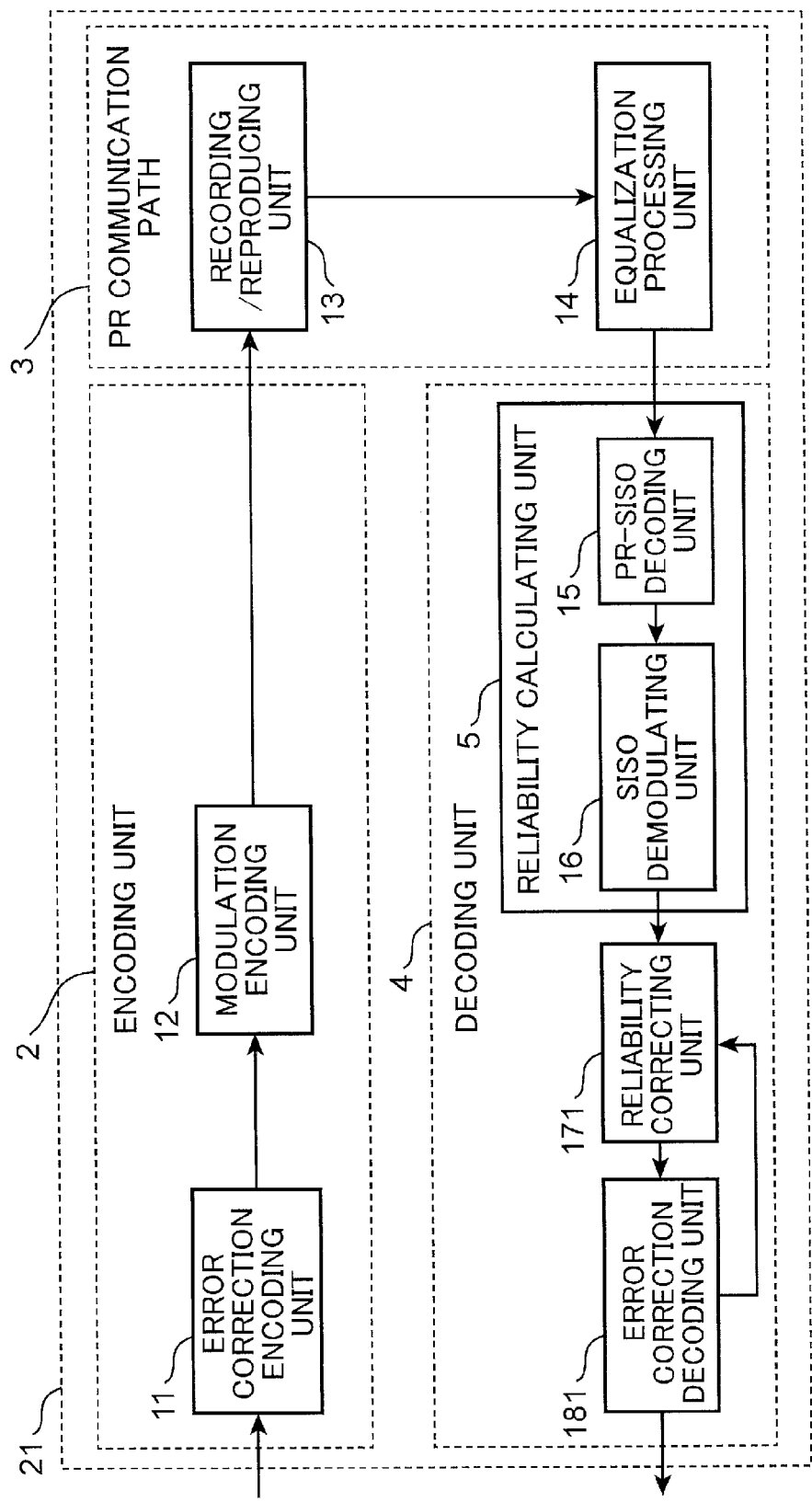
FIG. 6 is a diagram showing a configuration of a decoding device according to a fifth embodiment of the present invention.

FIG. 6 is a diagram showing a configuration of a decoding device according to a fifth embodiment of the present invention. A decoding device 21 shown in FIG. 6 comprises an encoding unit 2, a PR communication path 3, and a decoding unit 4. The encoding unit 2 comprises an error correction encoding unit 11 and a modulation encoding unit 12. The PR communication path 3 comprises a recording/reproducing unit 13 and an equalization processing unit 14. The decoding unit 4 comprises a reliability calculating unit 5, a reliability correcting unit 171, and an error correction decoding unit 181.

With the fifth embodiment, since a configuration with the exception of the reliability correcting unit 171 and the error correction decoding unit 181 is the same as that of the first embodiment or the second embodiment, only a configuration and operations of the reliability correcting unit 171 and the error correction decoding unit 181 which constitute a difference will be described. Since the configuration other than the reliability correcting unit 171 and the error correction decoding unit 181 is the same as that of the first embodiment or the second embodiment, a description thereof will be omitted.

Upon finish of LDPC decoding, for example, the error correction decoding unit 181 supplies success or failure of decoding, reliability information before and after correction, statistics, numbers of bit errors based on reliability information before and after correction, bit error rates based on reliability information before and after correction, or the like to the reliability correcting unit 171 as an LDPC decoding result.

The reliability correcting unit 171 sets a positive threshold and a negative threshold based on a result of error correction decoding by the error correction decoding unit 181. The LDPC decoding result is supplied to the reliability correcting unit 171 from the error correction decoding unit 181, whereby the reliability correcting unit 171 reflects the supplied LDPC decoding result in a correction value and modifies a reliability information correction system in order to prevent a next decoding from failing.

For example, when an LDPC decoding result to the effect that a previous decoding had failed and that reliability information has a large dispersion is supplied from the error correction decoding unit 181, the reliability correcting unit 171 sets a threshold for correcting reliability information to a smaller value. Accordingly, since correction is performed so as to reduce dispersion of reliability information that is next inputted to the error correction decoding unit 181, a probability of success of a next LDPC decoding increases.

In addition, for example, when an LDPC decoding result to the effect that an average value of reliability information prior to correction is large or reliability information has a large dispersion is supplied from the error correction decoding unit 181, the reliability correcting unit 171 may set a threshold for correcting reliability information to a smaller value. Accordingly, since reliability information that is next inputted to the error correction decoding unit 181 is corrected, a probability of success of a next LDPC decoding increases.

Furthermore, for example, when an LDPC decoding result to the effect that at least one of an average value and a dispersion of reliability information does not vary significantly between before and after correction is supplied from the error correction decoding unit 181, the reliability correcting unit 171 may set a threshold for correcting reliability information to a smaller value. Accordingly, since reliability information that is next inputted to the error correction decoding unit 181 is corrected, a probability of success of a next LDPC decoding increases.

In addition, for example, when an LDPC decoding result to the effect that the number of bit errors or a bit error rate based on reliability information before and after correction is larger than a value set in advance is supplied from the error correction decoding unit 181, the reliability correcting unit 171 may set a threshold for correcting reliability information to a smaller value. Accordingly, since reliability information that is next inputted to the error correction decoding unit 181 is corrected, a probability of success of a next LDPC decoding increases.

Furthermore, for example, when an LDPC decoding result to the effect that the number of bit errors or a bit error rate based on reliability information before and after correction has varied significantly from a previous value is supplied from the error correction decoding unit 181, the reliability correcting unit 171 may set a threshold for correcting reliability information to a smaller value. Accordingly, since reliability information that is next inputted to the error correction decoding unit 181 is corrected, a probability of success of a next LDPC decoding increases.

In addition, instead of setting a smaller threshold as described above, for example, the reliability correcting unit 171 may set a threshold so that a correction value monotonically increases with respect to an input value and a variation in the correction value decreases as the input value is distanced from an origin as in the example of a relationship between an input value and a correction value shown in FIG. 3.

Furthermore, for example, the reliability correcting unit 171 may set an absolute value of a positive threshold and an absolute value of a negative threshold to a same value, replace an absolute value of positive reliability information which exceeds the absolute value of the positive threshold with the absolute value of the positive threshold, and replace an absolute value of negative reliability information which exceeds the absolute value of the negative threshold with the absolute value of the negative threshold.

In addition, for example, the reliability correcting unit 171 may set a value that is equal to or smaller than one half of an average of absolute values of reliability information as a threshold and replace an absolute value of reliability information that exceeds the threshold with the threshold.

Furthermore, for example, the reliability correcting unit 171 may set an absolute value of a positive threshold and an absolute value of a negative threshold to values that differ from each other, replace an absolute value of positive reliability information which exceeds the absolute value of the positive threshold with the absolute value of the positive threshold, and replace an absolute value of negative reliability information which exceeds the absolute value of the negative threshold with the absolute value of the negative threshold.

Sixth Embodiment

A decoding device according to a sixth embodiment of the present invention will be described.

Moreover, with the decoding device according to the sixth embodiment, since a configuration with the exception of the reliability correcting unit 17 is the same as that of the decoding device 1 according to the first embodiment or the second embodiment, only operations of the reliability correcting unit 17 which constitutes a difference will be described in the sixth embodiment. Since the configuration other than the reliability correcting unit 17 is the same as that of the first embodiment or the second embodiment, a description thereof will be omitted.

The reliability correcting unit 17 according to the sixth embodiment varies a threshold every time or every plurality of times reliability information is inputted. The reliability correcting unit 17 varies a positive threshold and a negative threshold every time reliability information is inputted. For example, the decoding unit 4 may comprise a memory which stores an array of thresholds set in advance in accordance with the numbers of times reliability information is inputted. In this case, the reliability correcting unit 17 reads out a threshold corresponding to the number of times reliability information is inputted from the memory and sets the threshold.

In addition, for example, the decoding unit 4 may comprise a memory which stores a table in which the numbers of times reliability information is inputted and thresholds are associated with each other. In this case, the reliability correcting unit 17 reads out a threshold corresponding to the number of times reliability information is inputted from the table and sets the threshold.

Furthermore, for example, the reliability correcting unit 17 may set predetermined criteria for varying a positive threshold and a negative threshold with respect to inputted reliability information and vary the positive threshold and the negative threshold based on the predetermined criteria with respect to inputted reliability information or the like.

In addition, an external device that is connected to the decoding device 1 may input information related to the positive threshold and the negative threshold to the reliability correcting unit 17. The reliability correcting unit 17 may vary the positive threshold and the negative threshold based on information inputted from the external device.

Seventh Embodiment

A decoding device according to a seventh embodiment of the present invention will be described.

Moreover, with the decoding device according to the seventh embodiment, since a configuration with the exception of the reliability calculating unit 5 is the same as that of the decoding device 1 according to the first embodiment or the second embodiment, only operations of the reliability calculating unit 5 which constitutes a difference will be described in the seventh embodiment. Since the configuration other than the reliability calculating unit 5 is the same as that of the first embodiment or the second embodiment, a description thereof will be omitted.

The reliability calculating unit 5 according to the seventh embodiment outputs two types of reliability information respectively corresponding to a 0 bit and a 1 bit.

The reliability correcting unit 17 receives the two types of reliability information from the reliability calculating unit 5, and corrects the two types of reliability information according to the correction method described in any of the first to sixth embodiments.

Eighth Embodiment

An optical communication device according to an eighth embodiment of the present invention will be described.

Figure 7:
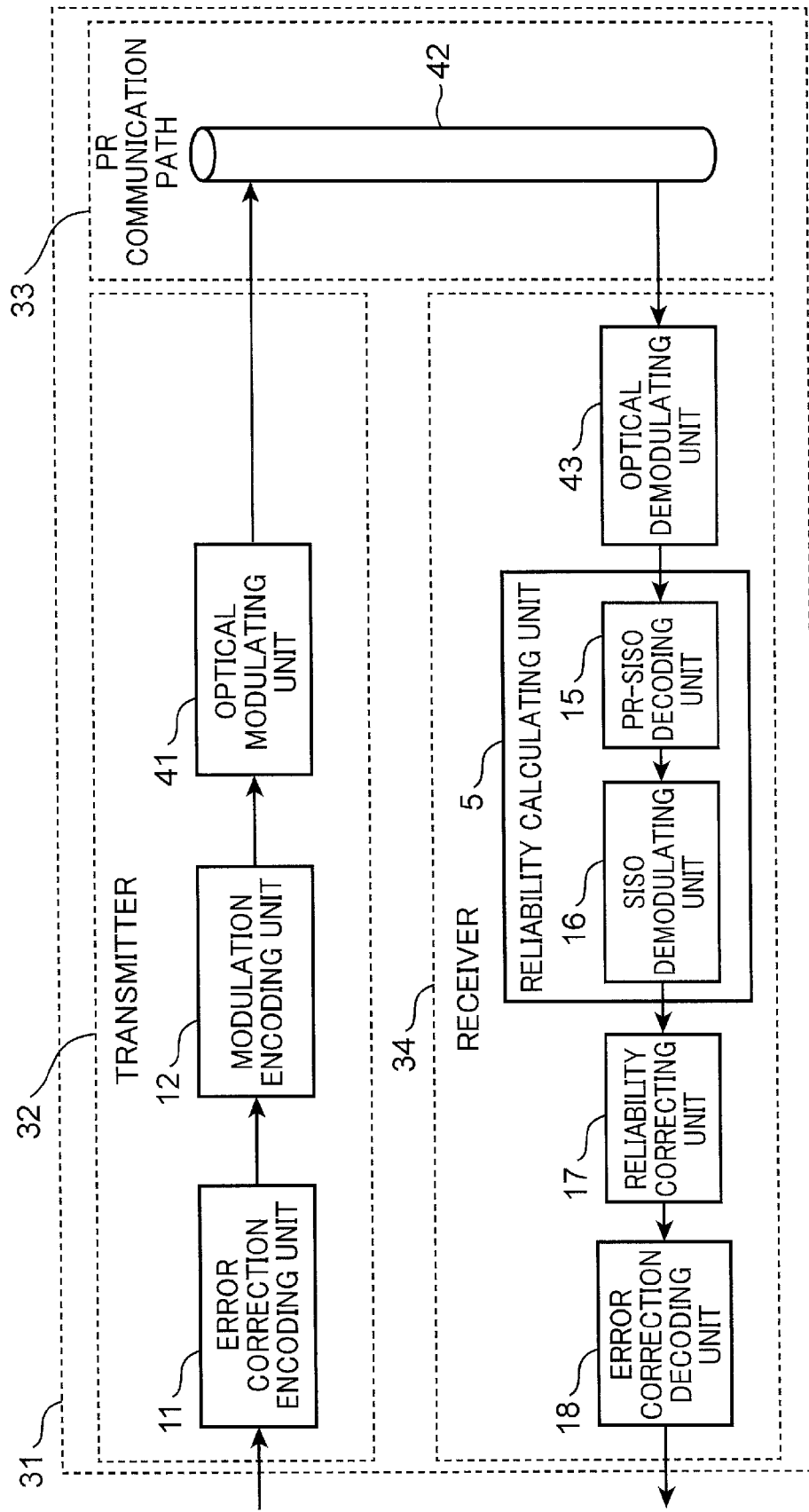
FIG. 7 is a diagram showing a configuration of an optical communication device according to an eighth embodiment of the present invention.
Figure 8:
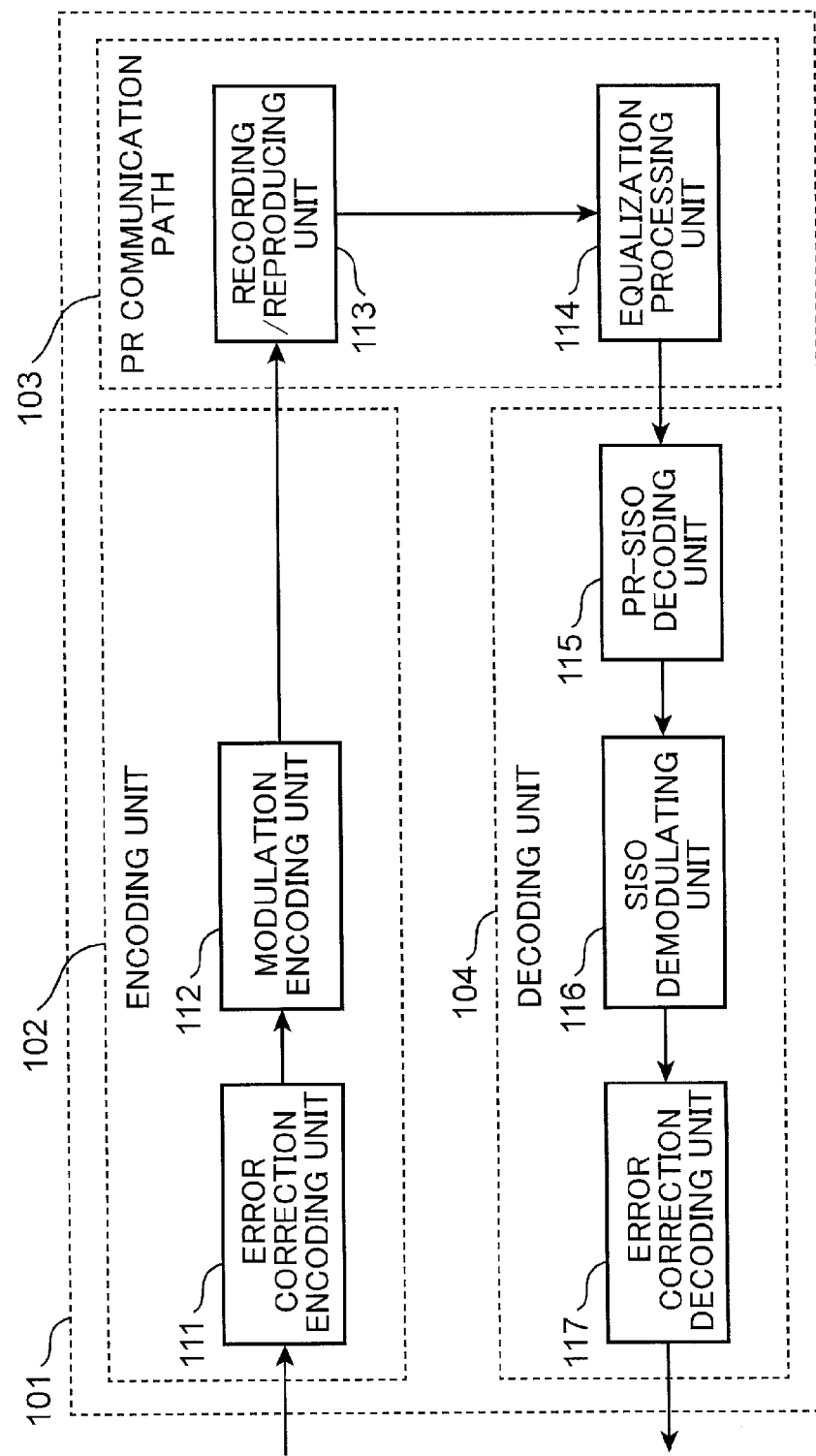
FIG. 8 is a diagram showing a configuration of a conventional recording/reproducing device.

FIG. 7 is a diagram showing a configuration of an optical communication device according to an eighth embodiment of the present invention. An optical communication device 31 shown in FIG. 7 comprises a transmitter 32, a PR communication path 33, and a receiver 34. The transmitter 32 which transmits transmission information comprises an error correction encoding unit 11, a modulation encoding unit 12, and an optical modulating unit 41. The PR communication path 33 comprises an optical fiber 42. The receiver 34 comprises a reliability calculating unit 5, a reliability correcting unit 17, an error correction decoding unit 18, and an optical demodulating unit 43.

With the eighth embodiment, since a configuration with the exception of the optical modulating unit 41, the optical fiber 42, and the optical demodulating unit 43 is the same as that of the first embodiment or the second embodiment, only configurations and operations of the optical modulating unit 41, the optical fiber 42, and the optical demodulating unit 43 which constitute a difference will be described. Since the configuration other than the optical modulating unit 41, the optical fiber 42, and the optical demodulating unit 43 is the same as that of the first embodiment or the second embodiment, a description thereof will be omitted.

The optical modulating unit 41 generates an optical signal waveform having intensity or a phase of light with a predetermined waveform modulated in accordance with an encoded sequence generated by the modulation encoding unit 12 and sends the optical signal waveform to the optical fiber 42. The optical fiber 42 transmits the optical signal waveform transmitted from the transmitter 32 to the receiver 34. The optical demodulating circuit 43 detects the intensity or the phase of light transmitted by the optical fiber 42 to convert the light into an electric signal and decodes the encoded sequence. The optical demodulating unit 43 outputs the decoded encoded sequence to the reliability calculating unit 5.

Moreover, the specific embodiments described above primarily include an invention configured as described below.

A decoding device according to an aspect of the present invention is a decoding device which decodes an encoded signal that is obtained when an encoded sequence generated by performing error correction encoding on input data according to a predetermined error correction encoding system and performing modulation encoding according to a predetermined modulation rule passes through a communication path, the decoding device comprising: a reliability information calculating unit which calculates reliability information having a non-linear relationship with a noise distribution of the communication path in at least part of or all of the reliability information based on characteristics of the communication path and the predetermined modulation rule from the encoded signal that is obtained from the communication path; a reliability information correcting unit which corrects the reliability information calculated by the reliability information calculating unit; and an error correction decoding unit which performs error correction decoding on the reliability information corrected by the reliability information correcting unit.

According to this configuration, a reliability information calculating unit calculates reliability information having a non-linear relationship with a noise distribution of a communication path in at least part of or all of the reliability information based on characteristics of the communication path and a predetermined modulation rule from an encoded signal that is obtained from the communication path. A reliability information correcting unit corrects the reliability information calculated by the reliability information calculating unit. An error correction decoding unit performs error correction decoding on the reliability information corrected by the reliability information correcting unit.

Therefore, since reliability information having a non-linear relationship with a noise distribution of a communication path in at least part of or all of the reliability information is corrected, an occurrence of an error bit with high reliability can be prevented and decoding performance can be improved.

In addition, in the decoding device described above, favorably, the input data is a sequence of pre-modulation symbols which are a set of minimum units of information, and the reliability information calculating unit calculates the reliability information based on a trellis in which a case exists where the number of combinations of the pre-modulation symbols that are decoding objects of modulation symbols generated by performing modulation encoding on the pre-modulation symbols is larger than the number of combinations of the pre-modulation symbols with an unequal decoding probability among the decoding objects or a trellis in which a case exists where there is a bias in an appearance frequency of minimum units of information which constitute the pre-modulation symbols among combinations of the pre-modulation symbols with the unequal decoding probability.

According to this configuration, input data is a sequence of pre-modulation symbols which are a set of minimum units of information. The reliability information calculating unit calculates the reliability information based on a trellis in which a case exists where the number of combinations of the pre-modulation symbols that are decoding objects of modulation symbols generated by performing modulation encoding on the pre-modulation symbols is larger than the number of combinations of the pre-modulation symbols with an unequal decoding probability among the decoding objects or a trellis in which a case exists where there is a bias in an appearance frequency of minimum units of information which constitute the pre-modulation symbols among combinations of the pre-modulation symbols with the unequal decoding probability.

Therefore, reliability information can be calculated based on a trellis in which a case exists where the number of combinations of the pre-modulation symbols that are decoding objects of modulation symbols generated by performing modulation encoding on the pre-modulation symbols is larger than the number of combinations of the pre-modulation symbols with an unequal decoding probability among the decoding objects. In addition, reliability information can be calculated based on a trellis in which a case exists where there is a bias in an appearance frequency of minimum units of information which constitute the pre-modulation symbols among combinations of the pre-modulation symbols with the unequal decoding probability.

Furthermore, in the decoding device described above, favorably, the reliability information correcting unit corrects the reliability information so that a correction value monotonically increases with respect to an input value and a variation in the correction value decreases as the input value is distanced from an origin.

According to this configuration, since reliability information is corrected so that a correction value monotonically increases with respect to an input value and a variation in the correction value decreases as the input value is distanced from an origin, an adverse effect when reliability information with a large value is erroneous can be prevented.

In addition, in the decoding device described above, favorably, the reliability information correcting unit sets an absolute value of a positive threshold and an absolute value of a negative threshold which are equal to each other, and corrects the reliability information so as to replace an absolute value of a positive input value which exceeds the absolute value of the positive threshold with the absolute value of the positive threshold and to replace an absolute value of a negative input value which exceeds the absolute value of the negative threshold with the absolute value of the negative threshold.

According to this configuration, an absolute value of a positive threshold and an absolute value of a negative threshold are set which are equal to each other. The reliability information is corrected to that an absolute value of a positive input value which exceeds the absolute value of the positive threshold is replaced with the absolute value of the positive threshold and an absolute value of a negative input value which exceeds the absolute value of the negative threshold is replaced with the absolute value of the negative threshold.

Therefore, since an absolute value of a positive input value which exceeds the absolute value of the positive threshold is replaced with the absolute value of the positive threshold and an absolute value of a negative input value which exceeds the absolute value of the negative threshold is replaced with the absolute value of the negative threshold, an occurrence of an error bit having high reliability can be more reliably prevented.

Furthermore, in the decoding device described above, favorably, the reliability information correcting unit sets an absolute value of a positive threshold and an absolute value of a negative threshold which differ from each other, and corrects the reliability information so as to replace an absolute value of a positive input value which exceeds the absolute value of the positive threshold with the absolute value of the positive threshold and to replace an absolute value of a negative input value which exceeds the absolute value of the negative threshold with the absolute value of the negative threshold.

According to this configuration, an absolute value of a positive threshold and an absolute value of a negative threshold are set which differ from each other. The reliability information is corrected to that an absolute value of a positive input value which exceeds the absolute value of the positive threshold is replaced with the absolute value of the positive threshold and an absolute value of a negative input value which exceeds the absolute value of the negative threshold is replaced with the absolute value of the negative threshold.

Therefore, since an absolute value of a positive input value which exceeds the absolute value of the positive threshold is replaced with the absolute value of the positive threshold and an absolute value of a negative input value which exceeds the absolute value of the negative threshold is replaced with the absolute value of the negative threshold, an occurrence of an error bit having high reliability can be more reliably prevented.

In addition, in the decoding device described above, favorably, the absolute value of the positive threshold is equal to or smaller than one half of an average of absolute values of positive reliability information and the absolute value of the negative threshold is equal to or smaller than one half of an average of absolute values of negative reliability information.

According to this configuration, since the absolute value of the positive threshold is equal to or smaller than one half of an average of absolute values of positive reliability information and the absolute value of the negative threshold is equal to or smaller than one half of an average of absolute values of negative reliability information, an occurrence of an error bit having high reliability can be more reliably prevented.

Furthermore, in the decoding device described above, favorably, the reliability information correcting unit sets the positive threshold and the negative threshold based on a result of error correction decoding by the error correction decoding unit.

According to this configuration, the positive threshold and the negative threshold are set based on a result of error correction decoding by the error correction decoding unit. Therefore, for example, when a previous error correction decoding had failed, for a next error correction decoding, reliability information is corrected using a positive threshold and a negative threshold which differ from those used in the previous error correction decoding. As a result, decoding performance of the next error correction decoding can be improved.

In addition, in the decoding device described above, favorably, the reliability information correcting unit varies the positive threshold and the negative threshold every time the reliability information is inputted.

According to this configuration, since the positive threshold and the negative threshold are varied every time the reliability information is inputted, the correction value can be changed to an appropriate value in accordance with the number of times reliability information is inputted and decoding performance of error correction decoding can be improved.

Furthermore, in the decoding device described above, favorably, the reliability information correcting unit sets a predetermined threshold and corrects the reliability information so as to replace an absolute value of the input value which exceeds the absolute value of the threshold with the absolute value of the threshold.

According to this configuration, a threshold determined in advance is set. Since the reliability information is corrected so as to replace an absolute value of the input value which exceeds the absolute value of the threshold with the absolute value of the threshold, an occurrence of an error bit having high reliability can be more reliably prevented.

In addition, in the decoding device described above, favorably, the error correction decoding unit performs error correction decoding using a low-density parity check code. According to this configuration, the error correction decoding can be performed using a low-density parity check encoding.

Furthermore, in the decoding device described above, favorably, the reliability calculating unit calculates the reliability information based on a trellis that is a composite of a trellis of partial response characteristics of the communication path and a trellis of the modulation rule.

According to this configuration, since reliability information is calculated based on a trellis that is a composite of a trellis of partial response characteristics of the communication path and a trellis of the modulation rule, circuit configuration can be simplified.

In addition, favorably, the decoding device described above further comprises an error correction encoding unit which performs error correction encoding on the input data and which outputs an encoded sequence subjected to the error correction encoding, a modulation encoding unit which performs modulation encoding on the encoded sequence subjected to the error correction encoding, a recording or reproducing unit which records the encoded sequence subjected to the modulation encoding on a recording medium or reproduces the encoded signal that is recorded on the recording medium, and an equalization processing unit which performs a predetermined equalization process on the encoded signal that is reproduced by the recording or reproducing unit, wherein the reliability information calculating unit calculates the reliability information based on characteristics of the communication path and the predetermined modulation rule from the encoded signal that has been subjected to the equalization process by the equalization processing unit.

According to this configuration, an error correction encoding unit performs error correction encoding on the input data and outputs an encoded sequence subjected to the error correction encoding. A modulation encoding unit performs modulation encoding on the encoded sequence subjected to the error correction encoding. A recording or reproducing unit records the encoded sequence subjected to the modulation encoding on a recording medium or reproduces the encoded signal that is recorded on the recording medium. An equalization processing unit performs a predetermined equalization process on the encoded signal that is reproduced by the recording or reproducing unit. The reliability information calculating unit calculates the reliability information based on characteristics of the communication path and the predetermined modulation rule from the encoded signal that has been subjected to the equalization process by the equalization processing unit.

Therefore, the decoding device can be applied to a device which records an encoded sequence subjected to modulation encoding on an information recording medium or reproduces an encoded signal recorded on an information recording medium.

A decoding method according to another aspect of the present invention is a decoding method of decoding an encoded signal that is obtained when an encoded sequence generated by performing error correction encoding on input data and performing modulation encoding according to a predetermined modulation rule passes through a communication path, the decoding method comprising: a reliability information calculating step of calculating reliability information having a non-linear relationship with a noise distribution of the communication path in at least part of or all of the reliability information based on characteristics of the communication path and the predetermined modulation rule from the encoded signal that is obtained from the communication path; a reliability information correcting step of correcting the reliability information calculated in the reliability information calculating step; and an error correction decoding step of performing error correction decoding on the reliability information corrected in the reliability information correcting step.

According to this configuration, in a reliability information calculating step, reliability information having a non-linear relationship with a noise distribution of a communication path in at least part of or all of the reliability information is calculated based on characteristics of the communication path and a predetermined modulation rule from an encoded signal that is obtained from the communication path. In a reliability information correcting step, the calculated reliability information is corrected. In an error correction decoding step, error correction decoding is performed on the corrected reliability information.

Therefore, since reliability information having a non-linear relationship with a noise distribution of a communication path in at least part of or all of the reliability information is corrected, an occurrence of an error bit with high reliability can be prevented and decoding performance can be improved.

It is to be understood that the specific embodiments or examples described in Description of Embodiments are merely illustrative of the technical contents of the present invention, and that the present invention should not be construed as being limited to such specific examples. Obviously, many modifications and variations of the present invention are possible without departing from the spirit of the invention and the scope of the following claims.

INDUSTRIAL APPLICABILITY

The decoding device and the decoding method according to the present invention are capable of preventing an occurrence of an error bit with a high reliability and improving decoding performance, and are useful as a decoding device and a decoding method which decode an encoded signal that is obtained when an encoded sequence generated by performing error correction encoding on input data according to a predetermined error correction encoding system and performing modulation encoding according to a predetermined modulation rule passes through a communication path.

The invention claimed is:

1. A decoding device which decodes an encoded signal that is obtained when an encoded sequence generated by performing error correction encoding on input data according to a predetermined error correction encoding system and performing modulation encoding according to a predetermined modulation rule passes through a communication path, the decoding device comprising:
a reliability information calculating unit which calculates reliability information having a non-linear relationship with a noise distribution of the communication path in at least part of or all of the reliability information based on characteristics of the communication path and the predetermined modulation rule from the encoded signal that is obtained from the communication path;
a reliability information correcting unit which corrects the reliability information calculated by the reliability information calculating unit; and
an error correction decoding unit which performs error correction decoding on the reliability information corrected by the reliability information correcting unit, wherein
the input data is a sequence of pre-modulation symbols which are a set of minimum units of information, and
the reliability information calculating unit calculates the reliability information based on a trellis in which a case exists where the number of combinations of the pre-modulation symbols that are decoding objects of modulation symbols generated by performing modulation encoding on the pre-modulation symbols is larger than the number of combinations of the pre-modulation symbols with an unequal decoding probability among the decoding objects or a trellis in which a case exists where there is a bias in an appearance frequency of minimum units of information which constitute the pre-modulation symbols among combinations of the pre-modulation symbols with the unequal decoding probability.

2. A decoding device which decodes an encoded signal that is obtained when an encoded sequence generated by performing error correction encoding on input data according to a predetermined error correction encoding system and performing modulation encoding according to a predetermined modulation rule passes through a communication path, the decoding device comprising:
a reliability information calculating unit which calculates reliability information having a non-linear relationship with a noise distribution of the communication path in at least part of or all of the reliability information based on characteristics of the communication path and the predetermined modulation rule from the encoded signal that is obtained from the communication path;
a reliability information correcting unit which corrects the reliability information calculated by the reliability information calculating unit; and
an error correction decoding unit which performs error correction decoding on the reliability information corrected by the reliability information correcting unit, wherein
the reliability information correcting unit corrects the reliability information so that a correction value monotonically increases with respect to an input value and a variation in the correction value decreases as the input value is distanced from an origin.

3. The decoding device according to claim 2, wherein the reliability information correcting unit sets an absolute value of a positive threshold and an absolute value of a negative threshold which are equal to each other, and corrects the reliability information so as to replace an absolute value of a positive input value which exceeds the absolute value of the positive threshold with the absolute value of the positive threshold and to replace an absolute value of a negative input value which exceeds the absolute value of the negative threshold with the absolute value of the negative threshold.

4. The decoding device according to claim 3, wherein
the absolute value of the positive threshold is equal to or smaller than one half of an average of absolute values of positive reliability information, and
the absolute value of the negative threshold is equal to or smaller than one half of an average of absolute values of negative reliability information.

5. The decoding device according to claim 3, wherein the reliability information correcting unit sets the positive threshold and the negative threshold based on a result of error correction decoding by the error correction decoding unit.

6. The decoding device according to claim 3, wherein the reliability information correcting unit varies the positive threshold and the negative threshold every time the reliability information is inputted.

7. The decoding device according to claim 2, wherein the reliability information correcting unit sets an absolute value of a positive threshold and an absolute value of a negative threshold which differ from each other, and corrects the reliability information so as to replace an absolute value of a positive input value which exceeds the absolute value of the positive threshold with the absolute value of the positive threshold and to replace an absolute value of a negative input value which exceeds the absolute value of the negative threshold with the absolute value of the negative threshold.

8. The decoding device according to claim 2, wherein the reliability information correcting unit sets a predetermined threshold and corrects the reliability information so as to replace an absolute value of the input value which exceeds the absolute value of the threshold with the absolute value of the threshold.

9. The decoding device according to claim 1, wherein the error correction decoding unit performs error correction decoding using a low-density parity check code.

10. The decoding device according to claim 1, wherein the reliability information calculating unit calculates the reliability information based on a trellis that is a composite of a trellis of partial response characteristics of the communication path and a trellis of the modulation rule.

11. The decoding device according to claim 1, further comprising:
an error correction encoding unit which performs error correction encoding on the input data and which outputs an encoded sequence subjected to the error correction encoding;
a modulation encoding unit which performs modulation encoding on the encoded sequence subjected to the error correction encoding;
a recording or reproducing unit which records the encoded sequence subjected to the modulation encoding on a recording medium or reproduces the encoded signal that is recorded on the recording medium; and
an equalization processing unit which performs a predetermined equalization process on the encoded signal that is reproduced by the recording or reproducing unit, wherein
the reliability information calculating unit calculates the reliability information based on characteristics of the communication path and the predetermined modulation rule from the encoded signal that has been subjected to the equalization process by the equalization processing unit.

12. A decoding method of decoding an encoded signal that is obtained when an encoded sequence generated by performing error correction encoding on input data according to a predetermined error correction encoding system and performing modulation encoding according to a predetermined modulation rule passes through a communication path, the decoding method comprising:
a reliability information calculating step of calculating reliability information having a non-linear relationship with a noise distribution of the communication path in at least part of or all of the reliability information based on characteristics of the communication path and the predetermined modulation rule from the encoded signal that is obtained from the communication path;
a reliability information correcting step of correcting the reliability information calculated in the reliability information calculating step; and
an error correction decoding step of performing error correction decoding on the reliability information corrected in the reliability information correcting step, wherein
the input data is a sequence of pre-modulation symbols which are a set of minimum units of information, and
in the reliability information calculating step, the reliability information is calculated based on a trellis in which a case exists where the number of combinations of the pre-modulation symbols that are decoding objects of modulation symbols generated by performing modulation encoding on the pre-modulation symbols is larger than the number of combinations of the pre-modulation symbols with an unequal decoding probability among the decoding objects or a trellis in which a case exists where there is a bias in an appearance frequency of minimum units of information which constitute the pre-modulation symbols among combinations of the pre-modulation symbols with the unequal decoding probability.

* * * * *